(12) United States Patent
Kawachi et al.

(10) Patent No.: US 7,879,516 B2
(45) Date of Patent: Feb. 1, 2011

(54) MANUFACTURING METHOD OF SEMICONDUCTOR INTEGRATED CIRCUIT DEVICE

(75) Inventors: Toshihide Kawachi, Tokyo (JP); Hidekimi Fudo, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 269 days.

(21) Appl. No.: 12/101,956

(22) Filed: Apr. 11, 2008

(65) Prior Publication Data

US 2008/0292977 A1    Nov. 27, 2008

(30) Foreign Application Priority Data

May 23, 2007    (JP)    ............................. 2007-136071

(51) Int. Cl.
G03C 5/00    (2006.01)
G03F 7/00    (2006.01)
(52) U.S. Cl. ..................... 430/30; 430/311; 356/237.1
(58) Field of Classification Search ............... 430/5, 430/22, 30, 311–313, 394; 356/124, 125, 356/401, 445, 237.1–237.5, 243.1
See application file for complete search history.

(56) References Cited

U.S. PATENT DOCUMENTS

| | | | |
|---|---|---|---|
| 5,867,276 A * | 2/1999 | McNeil et al. | 356/445 |
| 6,762,111 B2 | 7/2004 | Fukuda | |
| 7,119,893 B2 | 10/2006 | Littau et al. | |
| 2003/0048458 A1* | 3/2003 | Mieher et al. | 356/601 |
| 2005/0185174 A1* | 8/2005 | Laan et al. | 356/243.1 |
| 2006/0183040 A1* | 8/2006 | Sasazawa et al. | 430/30 |
| 2007/0222979 A1* | 9/2007 | Van Der Laan et al. | 356/243.1 |

FOREIGN PATENT DOCUMENTS

| | | |
|---|---|---|
| JP | 10-135112 A | 5/1998 |
| JP | 2003-224057 A | 8/2003 |
| JP | 2006-228843 A | 8/2006 |
| JP | 2006-523039 A | 10/2006 |

OTHER PUBLICATIONS

Kawachi et al., "Highly Sensitive Focus Monitoring On Production Wafer by Scatterometry Measurements for 90/65-nm Node Devices", IEEE Transactions on Semiconductor Manufacturing, vol. 20, No. 3, Aug. 2007, pp. 222-231.

* cited by examiner

Primary Examiner—Mark F Huff
Assistant Examiner—Stewart A Fraser
(74) Attorney, Agent, or Firm—Miles & Stockbridge P.C.

(57) ABSTRACT

In the semiconductor integrated circuit device lithography process it is becoming more and more essential to control both exposure dose and focus value independently with a high accuracy. Using a wafer treated precedingly, a section profile of a photoresist is acquired by the technique of scatterometry, then both exposure dose and focus value are estimated independently with a high accuracy on the basis of the section profile thus acquired and using a conjectural expression obtained by the technique of multivariate analysis, and a focus setting in the exposure of a succeedingly treated wafer is corrected on the basis of the estimated exposure dose and focus value.

15 Claims, 14 Drawing Sheets

FIG. 14

Focus =

$1.81188 \times 10^{-2} - 9.29152 \times 10^{-2} \times LW4$ $-9.29152 \times 10^{-2} \times LW5 - 1.00728 \times SWA5$ $-8.10739 \times 10^{-2} \times Thick6 - 2.05624 \times 10^{-1} \times LW6$ $-9.01024 \times 10^{-1} \times SWA6 + 1.79057 \times 10^{-1} \times LW7$ $+1.31239 \times 10^{-1} \times Thick8 + 1.79057 \times 10^{-1} \times LW8$ $-1.12879 \times 10^{-1} \times SWA8$

FIG. 15

| DEVICE MANUFACTURER | MODEL | DETECTING METHOD | | OPTICAL SYSTEM | TEG SIZE (μm) | POLARIZATION DETECTION | WAVEFORM TREATMENT |
|---|---|---|---|---|---|---|---|
| | | METHOD | WAVELENGTH (nm) | | | | |
| NANOMETRIX | ATLAS | SR | 320~780 | VERTICAL INCIDENCE | 50 | TE/TM | REAL TIME AND LIBRARY |
| | | SE | 190~780 | OBLIQUE INCIDENCE | 60 | DETECTED BY 360° ROTATION OF ILLUMINATION POLARIZATION | REAL TIME AND LIBRARY |
| | Nano OCD 9010T | SR | 210~780 | VERTICAL INCIDENCE | 50 | TE/TM | REAL TIME AND LIBRARY |
| KLA/Tencor | SCD200 SCD XT | SE | 190~800 | OBLIQUE INCIDENCE | 50 | DETECTED BY 360° ROTATION OF ILLUMINATION POLARIZATION | LIBRARY |
| Nova measuring Inc. | Nova Scan 3090 | SR | 250~900 | VERTICAL INCIDENCE | 50 | TE/TM | LIBRARY |
| TOKYO ELECTRON | i-ODP | SR | 320~790 | VERTICAL INCIDENCE | 50 | TE/TM | LIBRARY |
| Therma Wave | Opti-prove CD | SR | 190~820 | OBLIQUE INCIDENCE | 50 | DETECTED BY 360° ROTATION OF ILLUMINATION POLARIZATION | REAL TIME |

《EXPLANATION OF SYMBOLS》
SR (SPECTROSCOPIC REFLECTOMETRY)
SE (SPECTROSCOPIC ELLIPSOMETRY)
TE (TRANSVERSE ELECTRONIC WAVE)
TM (TRANSVERSE MAGNETIC WAVE)

MANUFACTURING METHOD OF SEMICONDUCTOR INTEGRATED CIRCUIT DEVICE

CROSS-REFERENCE TO RELATED APPLICATIONS

The disclosure of Japanese Patent Application No. 2007-136071 filed on May 23, 2007 including the specification, drawings and abstract is incorporated herein by reference in its entirety.

BACKGROUND OF THE INVENTION

The present invention relates to a technique applicable effectively to a photolithography process control technique in a method of manufacturing a semiconductor integrated circuit device (or a semiconductor device).

In Japanese Patent Laid-Open No. 2006-228843 (Patent Literature 1) or the corresponding U.S. Patent Laid-Open No. 2006-0183040 (Patent Literature 2) there is disclosed an APC (Advanced Process Control) method which estimates focus information by multivariate analysis from reflection spectrum data acquired using a scatterometer.

In Japanese Translation of PCT Application No. 2006-523039 (Patent Literature 3) or the corresponding U.S. Pat. No. 7,119,893 (Patent Literature 4) it is disclosed to evaluate a focal center with use of scatterometry.

In Japanese Patent Laid-Open No. Hei 10 (1998)-135112 (Patent Literature 5) it is disclosed that a photosensitivity parameter in a state of latent image in exposure is evaluated by detecting reflected light in exposure.

Further, in Japanese Patent-Laid Open No. 2003-224057 (Patent Literature 6) or the corresponding U.S. Pat. No. 6,762,111 (Patent Literature 7) it is disclosed to optimize alignment with use of scatterometry.

[Patent Literatures]
1. Japanese Patent Laid-Open No. 2006-228843
2. U.S. Patent Laid-Open No. 2006-0183040
3. Japanese Translation of PCT Application No. 2006-523039
4. U.S. Pat. No. 7,119,893
5. Japanese Patent Laid-Open No. Hei 10 (1998)-135112
6. Japanese Patent Laid-Open No. 2003-224057
7. U.S. Pat. No. 6,762,111

SUMMARY OF THE INVENTION

In a photolithoprocess, with the recent microfabrication of semiconductor process, it has been becoming difficult to ensure a sufficient focus margin in each step with respect to a focus budget (focus tolerance necessary for product flow in mass production). This is based on the background that it is difficult to solve the problem on the user side due to a limit encountered in the performance of exposure apparatus and of wafer, mask and resist materials. APC controlling focus quantity is now required in addition to the conventional APC controlling exposure dose alone. However, since no simple means is available for separation and quantitative determination of exposure dose and focus quantity, there has heretofore been adopted in many cases a method wherein the detection of every variation quantity is typified by measurement of an upper surface size with use of a CD-SEM (Critical Dimension-Scanning Electron Microscope) and there is performed dimensional APC controlling exposure dose alone.

It is an object of the present invention to provide a highly accurate control technique in a semiconductor integrated circuit device manufacturing process.

The above and other objects and novel features of the present invention will become apparent from the following description and the accompanying drawings.

The following is a brief description of a typical mode of the present invention as disclosed herein.

According to the present invention, a section profile of a photoresist is acquired by scatterometry using a precedingly processed wafer and focus setting in the exposure of a succeedingly processed wafer is corrected on the basis of the acquired section profile.

The following is a brief description of an effect obtained by the typical mode of the present invention as disclosed herein.

Since a focus value is estimated independently of exposure dose, it is possible to attain a highly accurate focus control.

BRIEF DESCRIPTION OF THE DRAWINGS

FIG. 14 shows an example of a conjectural expression derived by the PLS regression method in the semiconductor integrated circuit device manufacturing method of the embodiment; and FIG. 15 is a list of scatterometers available at present out of those employable in the embodiment.

DETAILED DESCRIPTION OF PREFERRED EMBODIMENTS

Outline of an Embodiment

Figure 1:
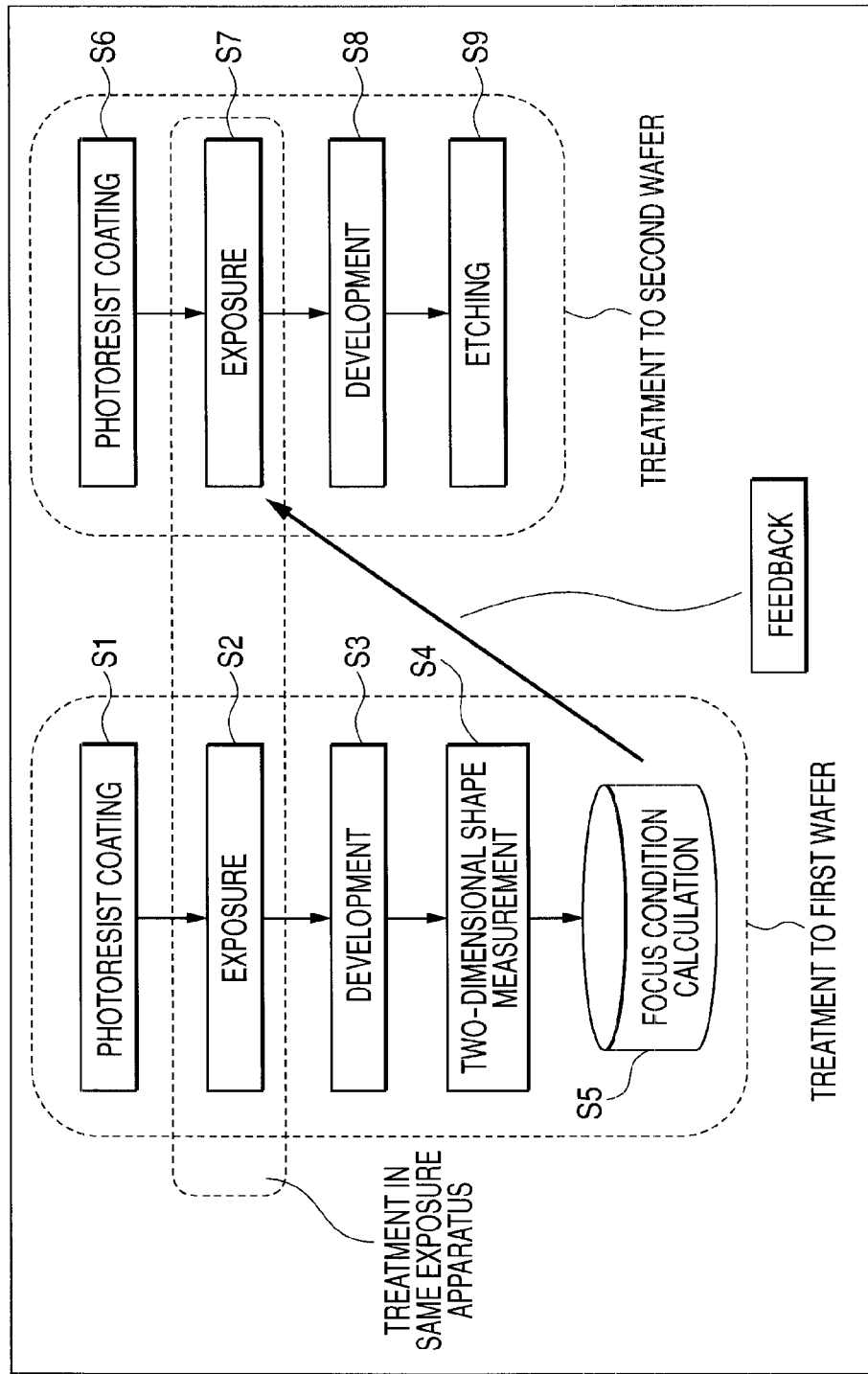
FIG. 1 is a process flow chart showing an entire flow of a semiconductor integrated circuit device manufacturing process according to an embodiment of the present invention.

First, typical modes of the present invention as disclosed herein will be outlined below.

1. A method of manufacturing a semiconductor integrated circuit device comprises the steps of:
   (a) forming a to-be-treated undercoat film over a first main surface of each of first and second wafers;
   (b) forming a photoresist film over the to-be-treated undercoat film formed over the first main surface of each of the first and second wafers;
   (c) exposing and developing the photoresist film formed over the first main surface of the first wafer by a reduced projection exposure apparatus to form a line and space pattern (another periodic or non-periodic pattern will do as well; the line and space pattern is advantageous in that the measurement accuracy is high) through the photoresist film;
   (d) measuring the line and space pattern formed over the first main surface of the first wafer optically by scatterometry to acquire parameters on a two-dimensional shape of a section of the line and space pattern;
   (e) estimating a focus condition on the basis of the parameters;
   (f) on the basis of the estimated focus condition, correcting a focus setting included among exposure conditions in the reduced projection exposure apparatus; and
   (g) on the basis of the corrected exposure condition, exposing and developing the photoresist film formed over the first main surface of the second wafer by the reduced projection exposure apparatus to form a circuit pattern (it suffices to include at least a product circuit pattern; this is true also in the following paragraphs) through the photoresist film.
2. In the method of the above paragraph 1, the first and second wafers are both product wafers.
3. In the method of the above paragraph 1 or 2, the line and space pattern formed over the first wafer is a product pattern.
4. In the method of the above paragraph 1 or 2, the line and space pattern formed over the first wafer is a TEG pattern.
5. In the method of any of the above paragraphs 1 to 4, the estimation in step (e) is made by calculation using the parameters acquired in step (d) and also using a conjectural expression obtained by multivariate regression analysis.
6. In the method of the above paragraph 5, the multivariate regression analysis is the PLS method.
7. In the method of any of the above paragraphs 1 to 6, a scatterometer used in the scatterometry is a vertical incidence type or an oblique incidence type.
8. A method of manufacturing a semiconductor integrated circuit device comprises the steps of:
   (a) forming a to-be-treated undercoat film over a first main surface of each of first and second wafers;
   (b) forming a photoresist film over the to-be-treated undercoat film formed over the first main surface of each of the first and second wafers;
   (c) exposing and developing the photoresist film formed over the first main surface of the first wafer by a reduced projection exposure apparatus to form a line and space pattern through the photoresist film;
   (d) measuring the line and space pattern formed over the first main surface of the first wafer optically by scatterometry to acquire parameters on a two-dimensional shape of a section of the line and space pattern;
   (e) estimating an exposure dose on the basis of the parameters;
   (f) on the basis of the estimated focus condition, correcting an exposure dose setting included among exposure conditions in the reduced projection exposure apparatus; and
   (g) on the basis of the corrected exposure condition, exposing and developing the photoresist film formed over the first main surface of the second wafer by the reduced projection exposure apparatus to form a circuit pattern through the photoresist film.
9. In the method of the above paragraph 8, the first and second wafers are both product wafers.
10. In the method of the above paragraph 8 or 9, the line and space pattern formed over the first wafer is a product pattern.
11. In the method of the above paragraph 8 or 9, the line and space pattern formed over the first wafer is a TEG pattern.
12. In the method of any of the above paragraphs 8 to 11, the estimation in step (e) is made by calculation using the parameters acquired in step (d) and also using a conjectural expression obtained by multivariate regression analysis.
13. In the method of the above paragraph 12, the multivariate regression analysis is the PLS method.
14. In the method of any of the above paragraphs 8 to 13, a scatterometer used in the scatterometry is a vertical incidence type or an oblique incidence type.
15. A method of manufacturing a semiconductor integrated circuit device comprises the steps of:
   (a) forming a to-be-treated undercoat film over a first main surface of each of first and second wafers;
   (b) forming a photoresist film over the to-be-treated undercoat film formed over the first main surface of each of the first and second wafers;
   (c) exposing and developing the photoresist film formed over the first main surface of the first wafer by a reduced projection exposure apparatus to form a line and space pattern through the photoresist film;
   (d) measuring the line and space pattern formed over the first main surface of the first wafer optically by scatterometry to acquire parameters on a two-dimensional shape of a section of the line and space pattern;
   (e) estimating a focus condition and an exposure dose independently on the basis of the parameters;
   (f) on the basis of the estimated focus condition and exposure dose, correcting a focus setting and an exposure dose setting both included among exposure conditions in the reduced projection exposure apparatus; and
   (g) on the basis of the corrected exposure conditions, exposing and developing the photoresist film formed over the first main surface of the second wafer by the reduced projection exposure apparatus to form a circuit pattern through the photoresist film.
16. In the method of the above paragraph 15, the first and second wafers are both product wafers.
17. In the method of the above paragraph 15 or 16, the line and space pattern formed on the first wafer is a product pattern.
18. In the method of the above paragraph 15 or 16, the line and space pattern formed over the first wafer is a TEG pattern.

19. In the method of any of the above paragraphs 15 to 18, the estimation in step (e) is made by calculation using the parameters acquired in step (d) and also using a conjectural expression obtained by multivariate regression analysis.
20. In the method of any of the above paragraphs 15 to 19, a scatterometer used in the scatterometry is a vertical incidence type or an oblique incidence type.

Next, other modes of the present invention as disclosed herein will be outlined below.

21. A method of manufacturing a semiconductor integrated circuit device using a wafer treating line to treat a multitude of wafers, comprises the steps of:
    (a) forming a to-be-treated undercoat film on a first main surface of each of first and second wafers included among the multitude of wafers;
    (b) forming a photoresist film on the to-be-treated undercoat film formed on the first main surface of each of the first and second wafers;
    (c) exposing and developing the photoresist film on the first main surface of the first water by a reduced projection exposure apparatus provided in the wafer treating line to form a line and space pattern through the photoresist film;
    (d) measuring the line and space pattern on the first main surface of the first wafer optically by scatterometry and thereby acquiring parameters on a two-dimensional shape of a section of the line and space pattern;
    (e) estimating a focus condition on the basis of the parameters;
    (f) on the basis of the estimated focus condition, correcting a focus setting included among exposure conditions in the reduced projection exposure apparatus; and
    (g) on the basis of the corrected exposure condition, exposing and developing the photoresist film on the first main surface of the second wafer by the reduced projection exposure apparatus to form a circuit pattern through the photoresist film.

Thus, according to principal modes of the present invention as disclosed herein, one of the wafers flowing along a mass-production line is taken out at a predetermined frequency (it is not necessary that the frequency be constant) after a specific developing process and resist section profile parameters are acquired by scatterometry, then on the basis of the acquired parameters there is estimated information on an exposure condition (e.g., focus condition) in an exposure step just before the developing process and further, on the basis of the estimated information, the exposure condition (e.g., focus condition) for the succeeding wafer to be subjected to the same treatment is changed to minimize offset of the exposure condition.

[Description Form, Basic Terms, and How to Use, in the Present Application]

1. An embodiment of the present invention may be described dividedly into plural sections where required for the sake of convenience, but unless otherwise mentioned, it is to be understood that the divided sections are not independent of each other, but configure portions of a single example, or in a relation such that one is a partial detail of the other or is a modification of part or the whole of the other. As to similar portions, repetition thereof is omitted in principle. Constituent elements in an embodiment are not essential unless otherwise mentioned and except the case where they are limited theoretically to specified numbers thereof, further, except the case where they are clearly essential contextually.
2. Likewise, in the description of an embodiment or the like, as to "X comprising A" or the like with respect to material and composition, selection of any other element than A as one of principal constituent elements is not excluded unless otherwise mentioned and except the case where it is evident contextually that A is not such a principal constituent element. For example, by the above description is meant "X including A as a principal component" when viewed with respect to a component. For example, "silicon member" is not limited to pure silicon, but it goes without saying that the silicon member in question covers SiGe alloy, other multi-element alloys containing silicon as principal component, as well as those containing silicon and other additives.
3. Although suitable examples will be shown as to figure, position and attribute, it goes without saying that no strict limitation is made to those examples unless otherwise mentioned and except the case where it is evident contextually that limitation is made thereto.
4. When reference is made to a specific numerical value or quantity, a numerical value larger or smaller than the specific numerical value will also do unless otherwise mentioned and except the case where limitation is made to the specific numerical value theoretically, further, except the case where a negative answer is evident contextually.
5. By "wafer" is usually meant a single crystal silicon wafer with semiconductor integrated circuit devices (also true of semiconductor devices and electronic devices) formed thereon. But it goes without saying that the "wafer" in question covers an epitaxial wafer and composite wafers, e.g., a combination of an insulating substrate and a semiconductor layer. Here, a 300 φ wafer will be described as an example, but wafers of other diameters are also employable almost similarly.
6. By "polysilicon" is meant to cover amorphous silicon, microcrystalline silicon, other intermediate ones, in addition to the ordinary polysilicon. The reason is that, between subordinate classifications, there occur mutual transformations by heat treatment and it is a delicate matter when there will occur changes and that it is difficult to describe them accurately.
7. As to "gate electrode," reference will here be made to a gate electrode using polysilicon as an example, provided no limitation is made thereto. There also are included gate electrodes using polycide, polymetal, a single or multi-layered metal film, or silicide. When it is not necessary to make classification specially, not only completed electrodes but also electrodes not patterned yet may also be called gate electrodes for the sake of convenience.
8. As to "anti-reflection film," reference will be made mainly about organic material-applied ones which material is later removed completely. However, other organic or inorganic type anti-reflection films are also employable difference is recognized in point of easiness of removal, timing, and necessity.
9. "Scatterometer" and "scatterometry" refer to a device such as, for example, "spectroscopic reflectometer" or "spectroscopic ellipsometer" and a technique. According to such device and technique, light having plural wavelengths or band widths is radiated to an object to be measured (mainly a film) and reflected light or diffracted light from the object is analyzed, including the stage of polarization, to acquire geometrical parameters (or associated parameters) of the object in a non-destructive manner. (The details are shown in FIG. 15.)

Details of Embodiment

A more detailed description will now be given about the embodiment. In the accompanying drawings, the same or similar portions are denoted by the same or similar symbols or reference numerals and explanations thereof will not be repeated in principle.

Figure 2:
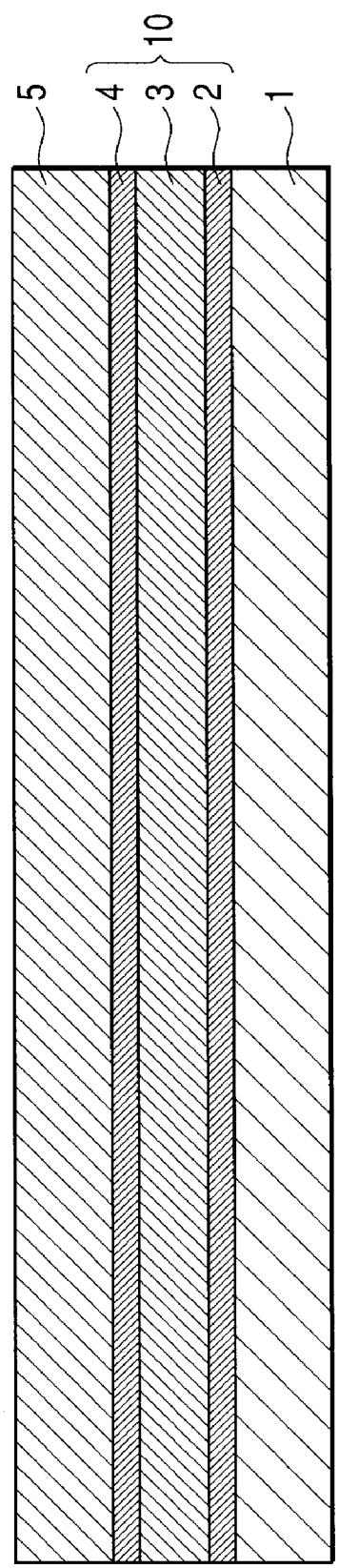
FIG. 2 is a sectional view showing a process for forming undercoat films and a photoresist film in the semiconductor integrated circuit device manufacturing method of the embodiment.
Figure 3:
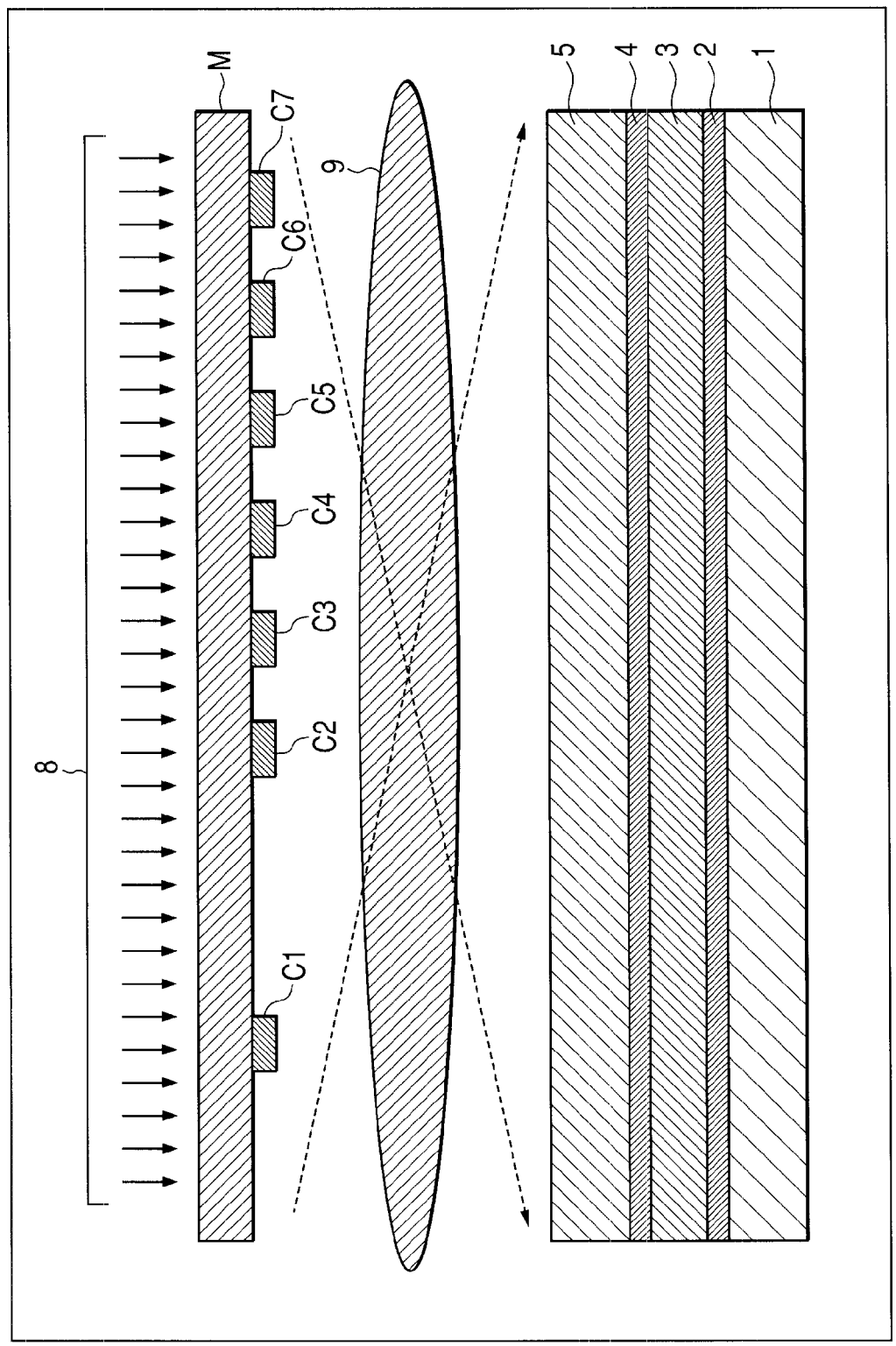
FIG. 3 is a schematic sectional view showing an exposure process in the semiconductor integrated circuit device manufacturing method of the embodiment.

The semiconductor integrated circuit device manufacturing method embodying the present invention will be described with reference to FIGS. 1 to 8. FIG. 1 is a process flow chart showing an entire flow of the method and FIGS. 2 to 8 are flow charts showing sections of wafers, etc. corresponding to constituent steps of the process flow. First, as shown in FIG. 2, an insulating film 2 as a gate insulating film is formed on almost the whole of a first main surface (device surface) of a first wafer 1 and a conductive material layer 3 as a gate electrode is formed thereon. Next, an anti-reflection film 4 (e.g., an organic material-applied film) is formed. (The films thus formed are designated "to-be-treated undercoat films" for the sake of convenience). Subsequently, a photoresist film 5 is formed by coating (photoresist coating step S1). Then, as shown in FIG. 3, using a reduced projection exposure apparatus, a product circuit pattern C1 and line and space patterns C2 to C7 for inspection (all of these patterns are designated "circuit patterns on the mask," but both patterns are not always essential, depending on the wafer concerned) on a mask M are exposed onto the photoresist film 5 through a projection optical system 9 (a projection optical system in the reduced projection exposure apparatus) using monochromatic exposure light 8 from an ArF eximer laser with a wavelength of 193 nm (exposure step S2).

Figure 4:
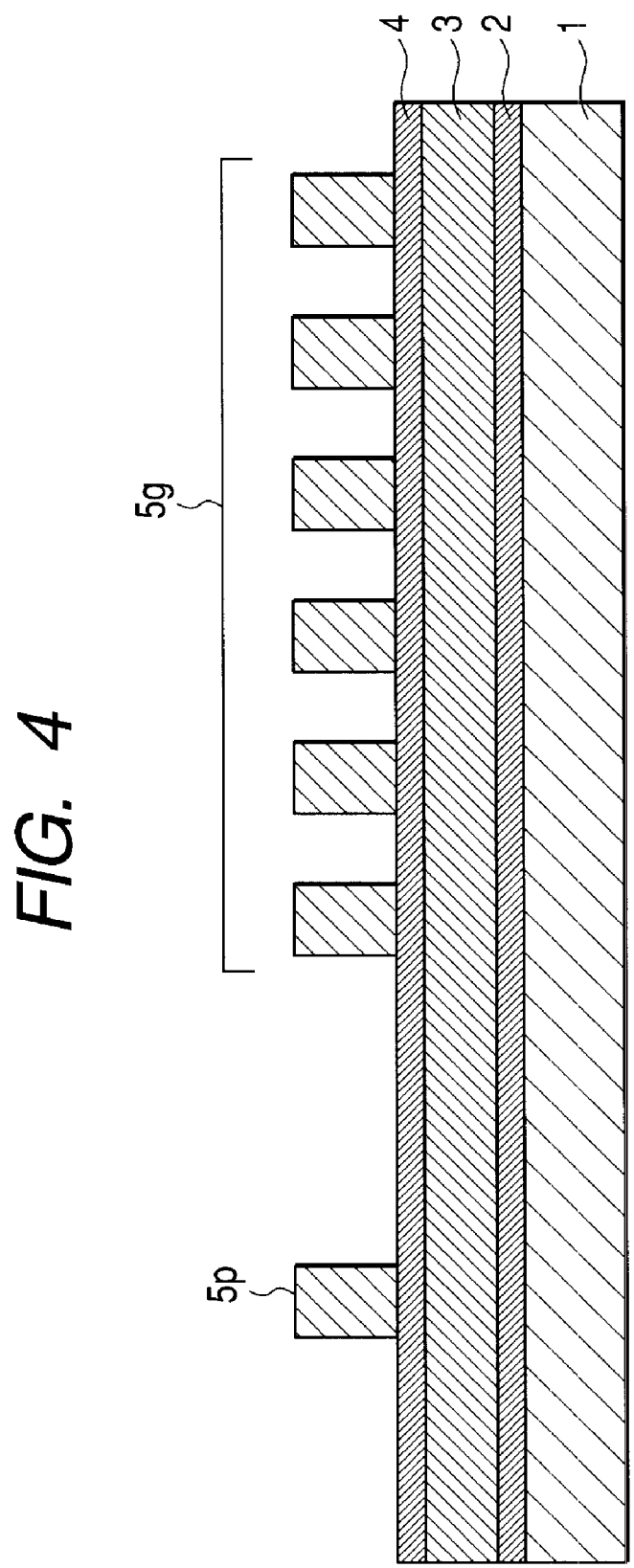
FIG. 4 is a sectional view showing a developing process in the semiconductor integrated circuit device manufacturing method of the embodiment.
Figure 5:
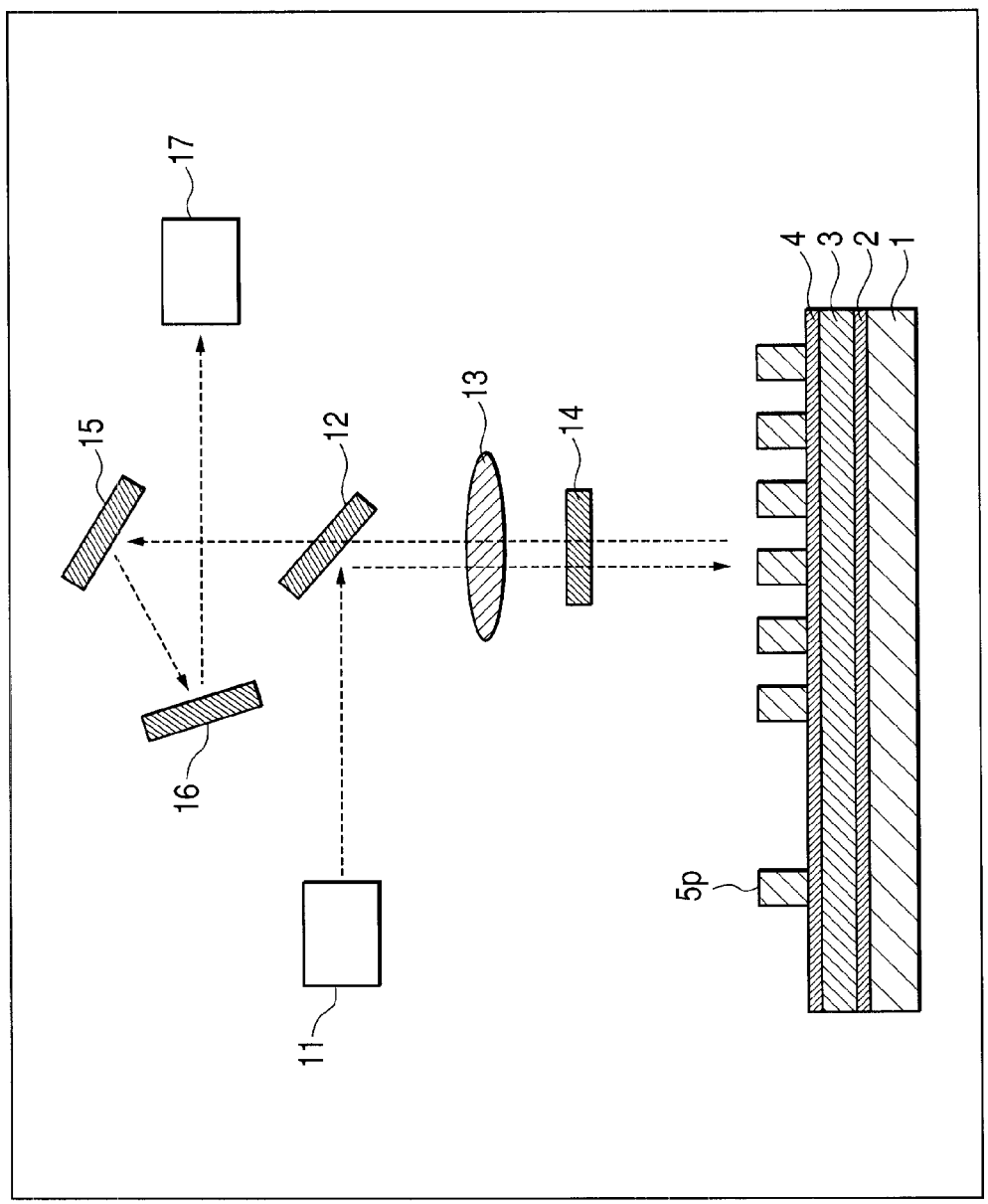
FIG. 5 is a schematic sectional view showing a three-dimensional shape measuring process in the semiconductor integrated circuit device manufacturing method of the embodiment.

Then, as shown in FIG. 4, a developing treatment is applied to the photoresist film 5 to form a product pattern 5P (this is not always essential, there may be used a wafer for inspection) and a line and space pattern 5g for inspection (this pattern is not always required to be a pattern for inspection only, there may be used a product pattern) (development step S3). Now, measurement of a two-dimensional shape (a section profile, i.e., a two-dimensional shape of a section) of the photoresist pattern 5g for inspection is conducted using a scatterometer (two-dimensional shape measuring step S4). More specifically, checking light having a predetermined band width (broad band light) and emitted from a light source 11 is reflected downward by a beam splitter 12, then passes through an objection optical system 13 and a polarization system 14 and is radiated to the line and space pattern 5g (acting as a one-dimensional diffraction grating). The modes of the incident light is limited by the polarization system 14 to TE mode with electric field perpendicular to the paper surface and TM mode with electric field parallel to the paper surface and orthogonal to lines of the line and space pattern 5g (as shown in FIG. 15, there are various types of scatterometric devices and no limitation is made to the one described here). Zero-order diffracted light from the line and space pattern 5g travels backward through the above optical path, passes through the beam splitter 12, then is split by a monochrometer 15 (generally a diffraction grating) and is detected by an array type detector via a mirror 16. Now, there is obtained a spectrum for each of the above modes.

Figure 11:
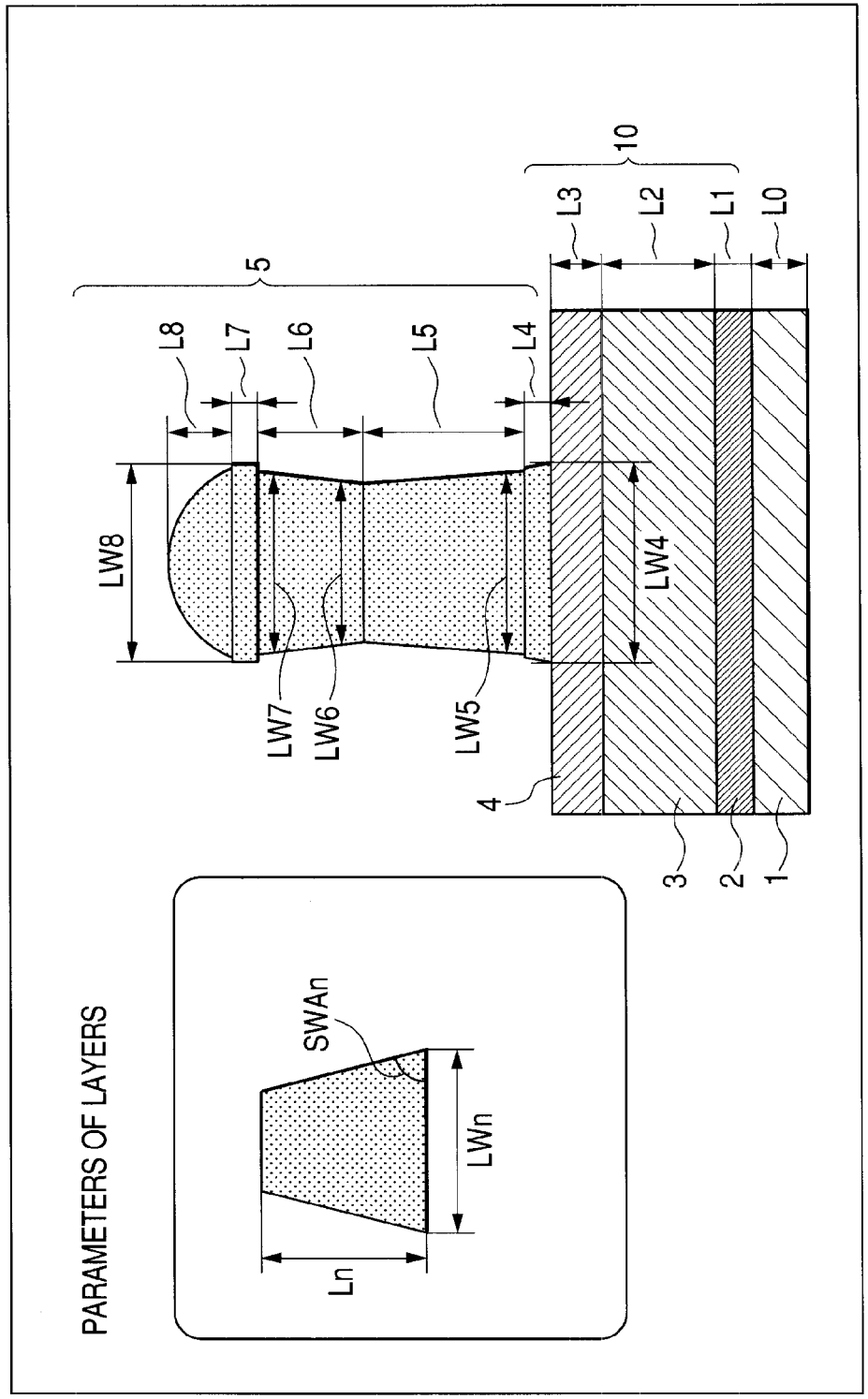
FIG. 11 is a schematic sectional view illustrating a parameter group which configures a profile in the two-dimensional shape measuring process (including measurement of first wafer, second wafer and sample wafer) according to the semiconductor integrated circuit device manufacturing method of the embodiment.

The spectra thus obtained are analyzed by a scatterometer, whereby there is obtained a section profile of the photoresist pattern 5g. As illustrated in FIG. 11, La represents the thickness of film indicated at n, LWn represents the width of a predetermined portion of film indicated at n, and SWAn represents an internal angle of the predetermined portion of film indicated at n. Average thicknesses of constituent films of an undercoat film 10, as well as variation ranges thereof, are given beforehand to the scatterometer. Of these parameters, those concerned directly with the photoresist film 5 are a group of parameters related to the photoresist film section profile.

By inserting the parameters thus obtained (a parameter group related to the photoresist film section profile) into a focus value conjectural expression which will be described in connection with FIG. 14, it is possible to estimate a focus value (also designated defocus quantity, focus set value, focus position, or focus offset quantity) independently of the exposure dose (focus condition calculating step S5).

Now, a shift is made to treating the second wafer shown in FIG. 1. As described previously in FIG. 2 with respect to the first wafer, there are formed an undercoat film 10 to be treated and a photoresist film 5 which is substantially the same as the previous one (photoresist coating step S6). Thereafter, using the same reduced projection exposure apparatus as that used in treating the first wafer, a mask M (generally the same mask as that used for the first wafer) carrying thereon almost the same product pattern C1 and almost the same inspection patterns C2 to C7, and further using almost the same exposure light, the product circuit pattern C1 and the line and space patterns C2 to C7 for inspection are exposed onto the photoresist film 5 (exposure step S7). At this time, the focus value setting in the reduced projection exposure apparatus is corrected on the basis of a pre-estimated focus value (feedback). Consequently, a more accurate focus setting can be effected, whereby the product circuit pattern 5P (FIG. 4) formed on the main surface of the second wafer is generally higher in accuracy than that on the first wafer. By repeating such a feedback (profile measurement for the preceding wafer, focus estimation based thereon, and correction of focus condition for the succeeding wafer) at a predetermined frequency (for every wafer or once every N sheets of wafer, namely, one or several sheets for each batch or for K batches, depending on the required accuracy), it is possible to minimize the offset of focus.

Figure 6:
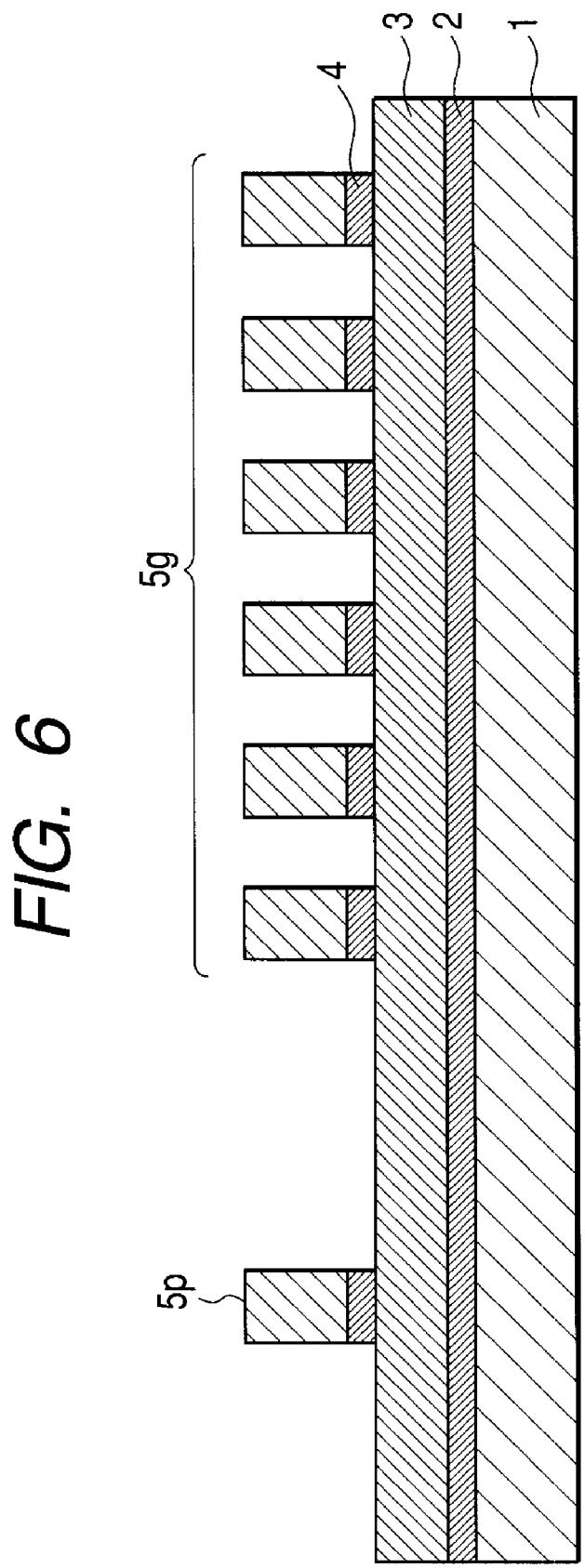
FIG. 6 is a sectional view showing an anti-reflection film etching process in the semiconductor integrated circuit device manufacturing method of the embodiment.
Figure 7:
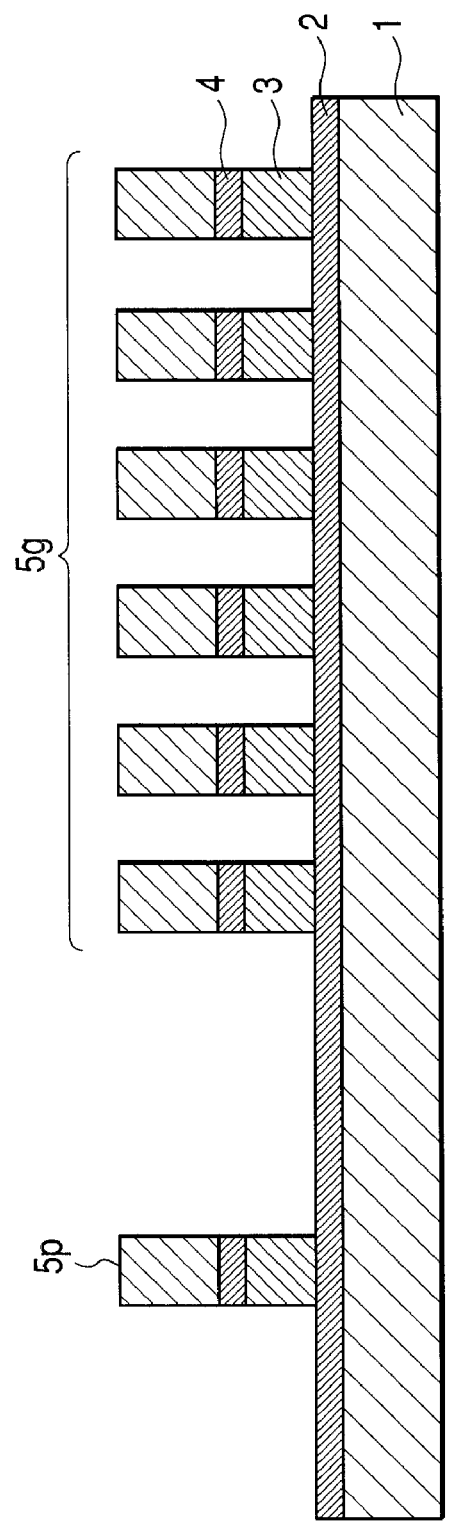
FIG. 7 is a sectional view showing a conductive film etching process in the semiconductor integrated circuit device manufacturing method of the embodiment.
Figure 8:
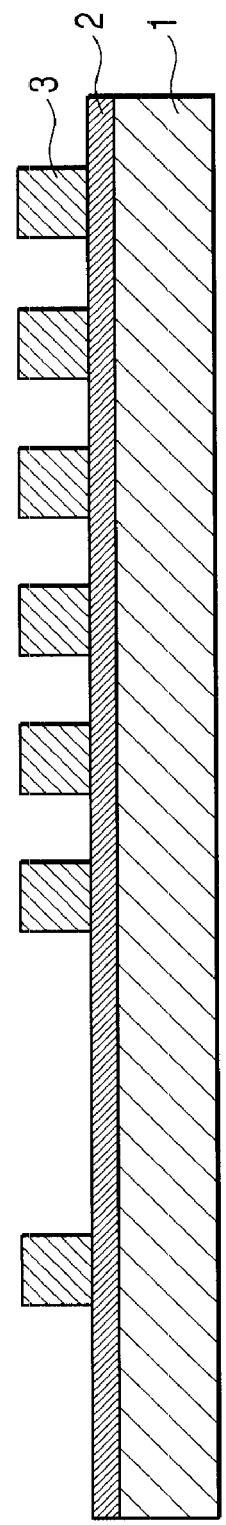
FIG. 8 is a sectional view showing a removing process of a resist and the like in the semiconductor integrated circuit device manufacturing method of the embodiment.
Figure 9:
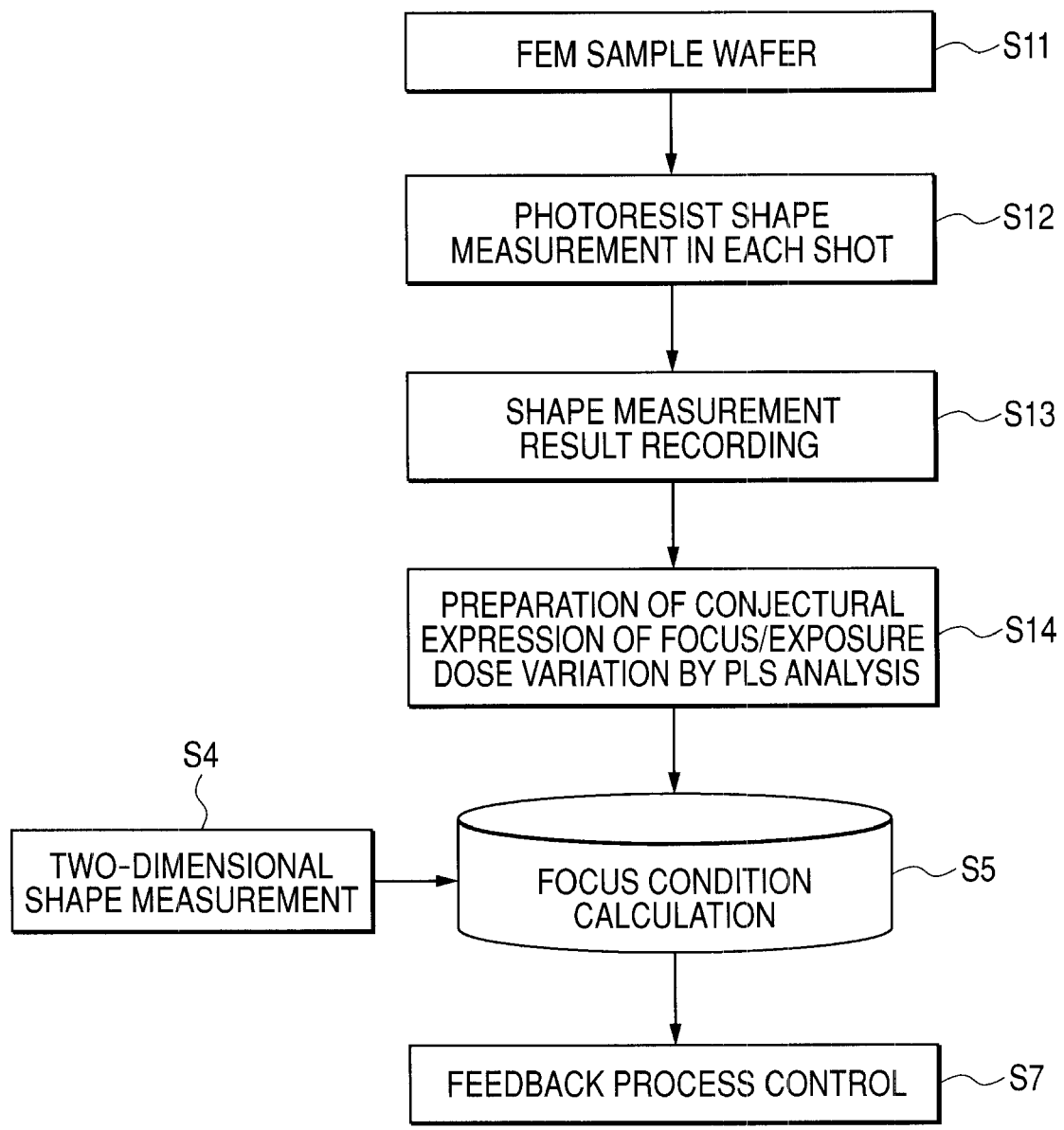
FIG. 9 is a flow chart showing the flow of a process up to conjectural derivation in the semiconductor integrated circuit device manufacturing method of the embodiment.
Figure 10:
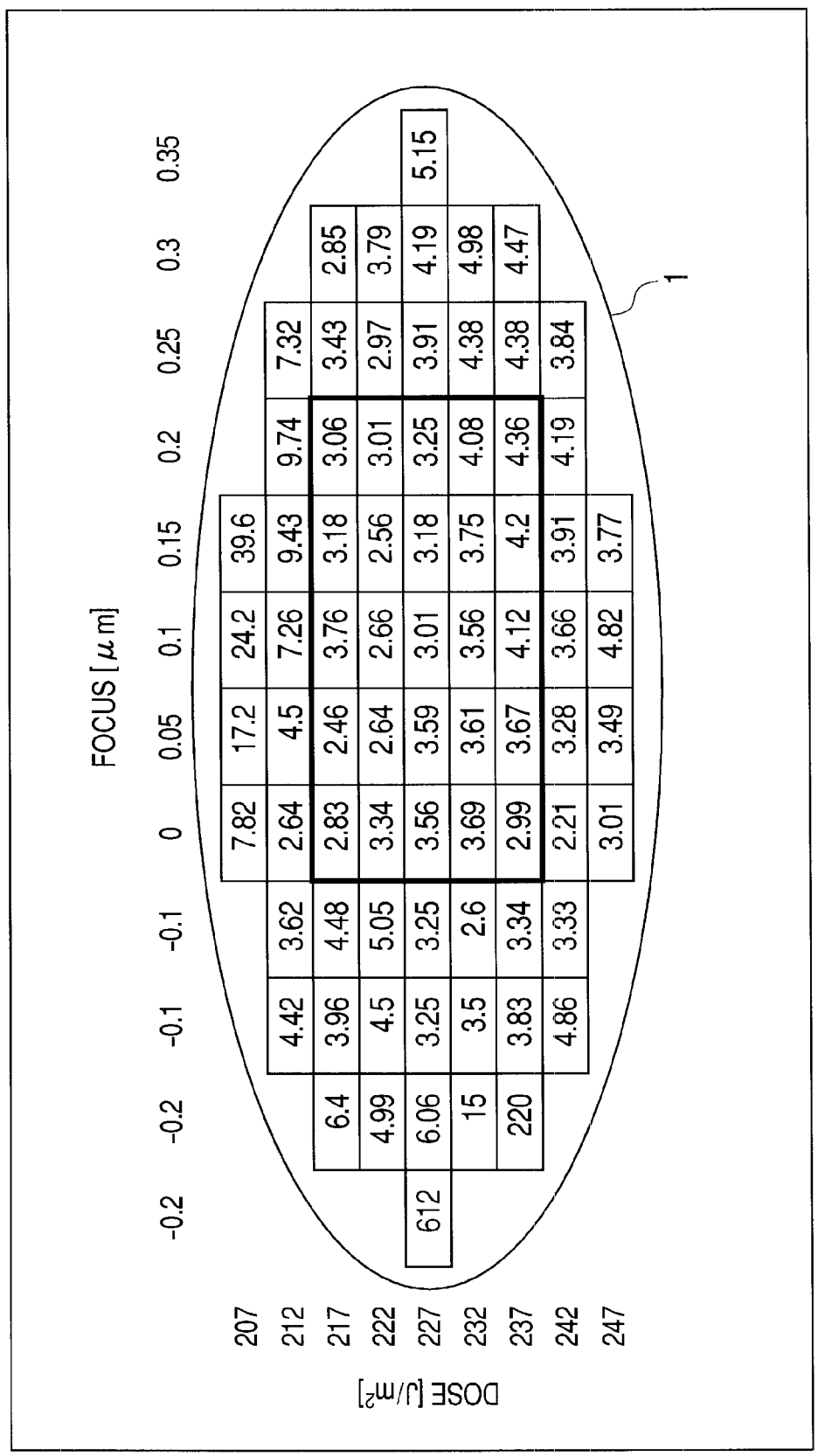
FIG. 10 is a schematic wafer top view showing an example of an FEM wafer used for conjectural derivation in the semiconductor integrated circuit device manufacturing method of the embodiment.

Thereafter, like the first wafer, as shown in FIG. 4, the second wafer (when the second wafer is a product wafer, the steps subsequent to this development is processed like the second wafer) is subjected to resist development (development step S8) like the first wafer, as shown in FIG. 4. When the second wafer is an object of inspection, it is subjected to two-dimensional shape measurement (two-dimensional shape measurement step S4) like the first wafer and then advances to an etching step S9. On the other hand, when the second wafer is not an object of inspection, the second wafer advances directly to the etching step S9, in which etching is performed for both anti-reflection film 4 and polysilicon film 3, as shown in FIGS. 6 and 7. The anti-reflection film which is unnecessary is subsequently removed as in FIG. 8.

Next, with reference to FIGS. 9 to 13, a description will be given about the procedure of deriving a focus conjectural expression shown in FIG. 14. First, there is provided an FEM wafer (Focus Exposure Matrix Wafer) with vertically varying focus values and dose values centered on zero (see FIG. 10) in each shot area (an integer multiple area of the chip area, indicating an area capable of being exposed in unit step of a step and repeat type or step and scan type exposure apparatus) of the wafer, using the same reduced projection exposure apparatus as that described above, (FEM sample wafer fabricating step S11). The numerical value in each shot area in FIG. 10 corresponds to the evaluation of coincidence between a theoretical waveform of scatterometry obtained with a two-dimensional shape model shown in FIG. 11 and a waveform measured actually, in terms of MSE (Mean Square Error). It is seen that satisfactory values nearly below "4.0" are shown within the area enclosed by a thick black frame.

Figure 12:
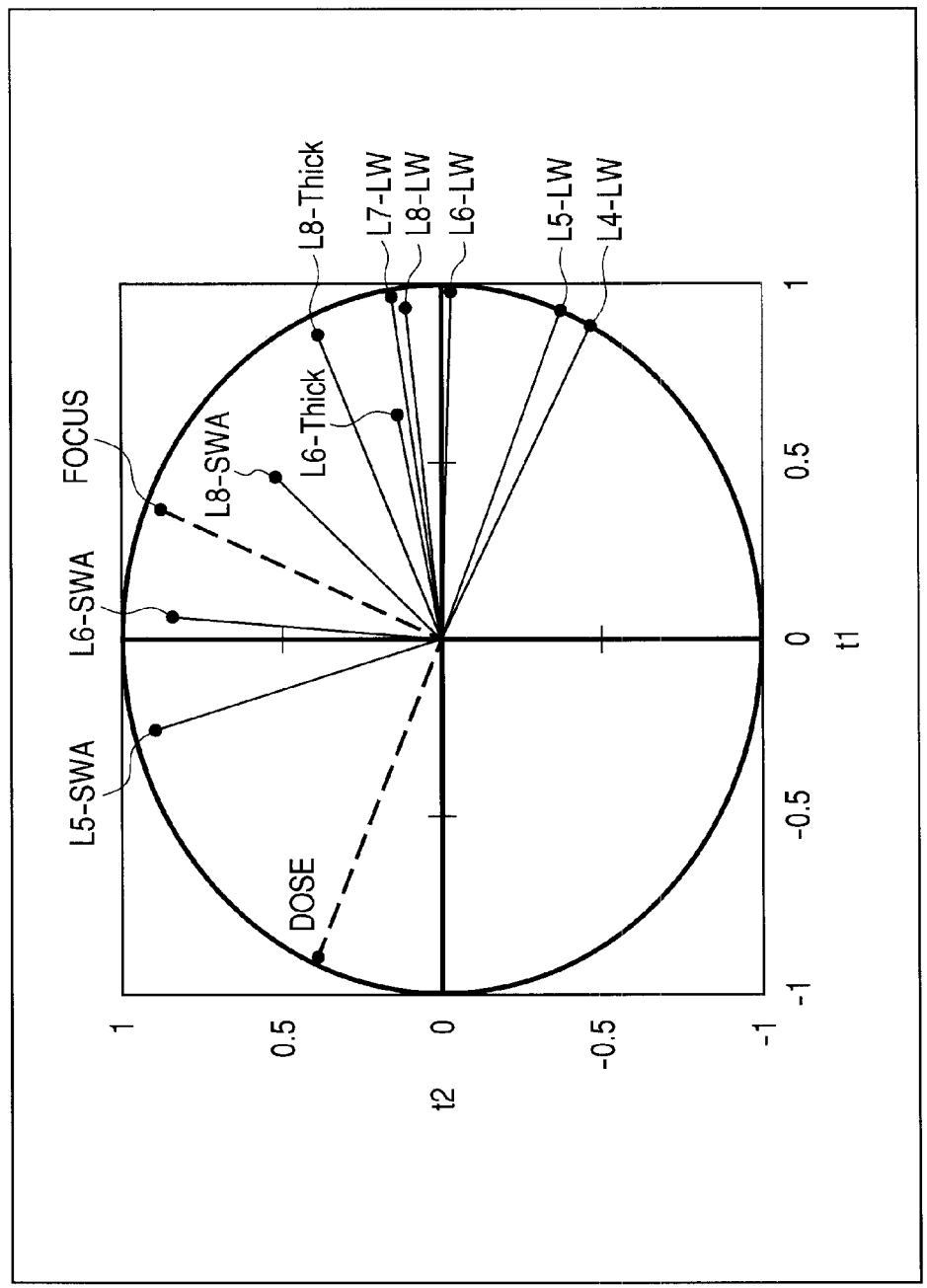
FIG. 12 is a schematic correlation diagram showing the relation between latent variables and existing parameters for explaining the PLS regression method used for conjectural derivation in the semiconductor integrated circuit device manufacturing method of the embodiment.
Figure 13:
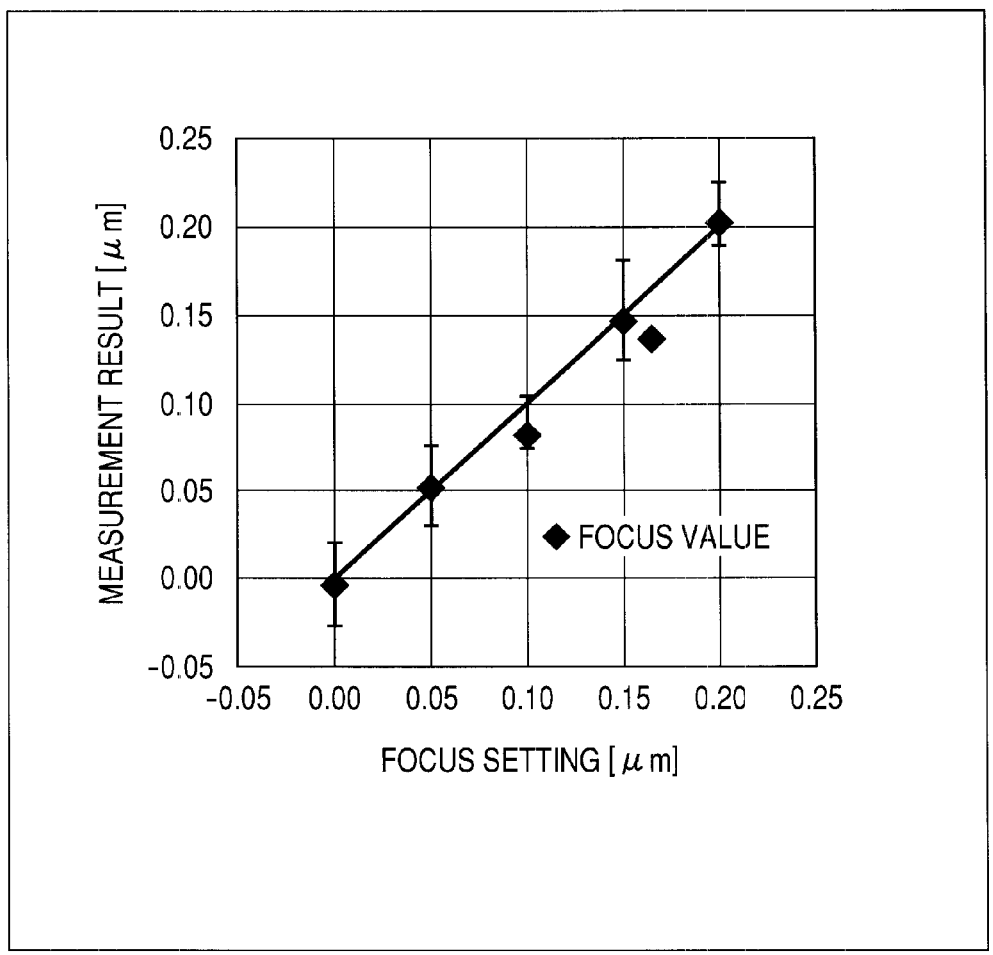
FIG. 13 is a diagram showing the relation between actual set focus values and a result estimated from measured results by a conjectural expression in order to show the state of coincidence of the conjectural expression in the semiconductor integrated circuit device manufacturing method of the embodiment.

Next, this sample wafer is subjected to substantially the same treatments as the treatments from photoresist coating S1 to focus condition calculation S4 applied to the first wafer with respect to the line and space patterns C2 to C7 for inspection. That is, the line and space patterns for inspection are formed in the same manner as in FIG. 4, then as in FIG. 5, there is made profile analysis using a scatterometer in the same manner as in FIG. 5 (photoresist shape measuring step S12). As a result, there is obtained a section profile parameter group of the photoresist film 5 shown in FIG. 11 for each dose. On the basis of the result thus obtained, a conjectural expression for estimating a focus value independently of the exposure dose is derived using PLS regression method (Partial Least Square Regression Method) corresponding to an improved method of linear multiple regression analysis which is a kind of multivariate analysis (conjectural expression preparing step S14). It is known that this method is applicable also in the case where there is multicollinearity. According to this method, for example as shown in FIG. 12, latent variables like t1 and t2 independent of each other are extracted from among many parameters dependent on dose or focus value, thereby permitting a highly accurate estimation. It is FIG. 13 that makes comparison between predicted values based on an expression (an example is shown in FIG. 14) obtained by in such a manner and focus set values in an actual exposure apparatus. It goes without saying that such a conjectural expression is obtained in accordance with the same procedure as above by not only the PLS regression method but also the conventional linear (non-linear as the case may be) multivariate regression analysis.

The scatterometer used in this embodiment will now be described. Main scatterometers available at present are shown in FIG. 15. In this embodiment, for the convenience of use, reference will be made to an example of using a vertical incidence type ATLAS manufactured by Nanometrix Co., but it goes without saying that this embodiment is not limited thereto, but is applicable also to methods using other devices.

Although the present invention has been described above concretely on the basis of an embodiment thereof, it goes without saying that the present invention is not limited to the above embodiment, but that various changes may be made within the scope not departing the gist of the invention.

For example, although the use of line and space patterns has been described above as an example of inspection pattern, it goes without saying that no limitation is made thereto, but that isolated patterns, inspection-dedicated patterns, and other periodic and non-periodic patterns, may also be used as inspection patterns.

What is claimed is:

1. A manufacturing method of a semiconductor integrated circuit device, comprising the steps of:
    (a) forming a to-be-treated undercoat film over a first main surface of each of first and second wafers;
    (b) forming a photoresist film over the to-be-treated undercoat film formed over the first main surface of each of the first and second wafers;
    (c) exposing and developing the photoresist film formed over the first main surface of the first wafer by a reduced projection exposure apparatus to form a line and space pattern through the photoresist film;
    (d) measuring the line and space pattern formed over the first main surface of the first wafer optically by scatterometry to acquire parameters on a two-dimensional shape of a section of the line and space pattern;
    (e) estimating a focus condition on the basis of the parameters;
    (f) on the basis of the estimated focus condition, correcting a focus setting included among exposure conditions in the reduced projection exposure apparatus; and
    (g) on the basis of the corrected exposure condition, exposing and developing the photoresist film formed over the first main surface of the second wafer by the reduced projection exposure apparatus to form a circuit pattern through the photoresist film,
    wherein the estimation in step (e) comprises performing a calculation using the parameters acquired in step (d) and using a conjectural expression obtained by multivariate regression analysis of a partial least squares (PLS) method.

2. The method according to claim 1, wherein the first and second wafers are both product wafers.

3. The method according to claim 2, wherein the line and space pattern formed over the first wafer is a product pattern.

4. The method according to claim 2, wherein the line and space pattern formed over the first wafer is an inspection pattern.

5. The method according to claim 1, wherein a scatterometer used in the scatterometry is a vertical incidence type or an oblique incidence type.

6. A manufacturing method of a semiconductor integrated circuit device, comprising the steps of:
    (a) forming a to-be-treated undercoat film over a first main surface of each of first and second wafers;
    (b) forming a photoresist film over the to-be-treated undercoat film formed over the first main surface of each of the first and second wafers;
    (c) exposing and developing the photoresist film formed over the first main surface of the first wafer by a reduced projection exposure apparatus to form a line and space pattern through the photoresist film;
    (d) measuring the line and space pattern formed over the first main surface of the first wafer optically by scatterometry to acquire parameters on a two-dimensional shape of a section of the line and space pattern;
    (e) estimating an exposure dose on the basis of the parameters;
    (f) on the basis of the estimated exposure dose, correcting an exposure dose setting included among exposure conditions in the reduced projection exposure apparatus; and
    (g) on the basis of the corrected exposure condition, exposing and developing the photoresist film formed over the first main surface of the second wafer by the reduced projection exposure apparatus to form a circuit pattern through the photoresist film,
    wherein the estimation in step (e) comprises performing a calculation using the parameters acquired in step (d) and using a conjectural expression obtained by multivariate regression analysis of a partial least squares (PLS) method.

7. The method according to claim 6, wherein the first and second wafers are both product wafers.

8. The method according to claim 7, wherein the line and space pattern formed over the first wafer is a product pattern.

9. The method according to claim 7, wherein the line and space pattern formed over the first wafer is an inspection pattern.

10. The method according to claim 6, wherein a scatterometer used in the scatterometry is a vertical incidence type or an oblique incidence type.

11. A manufacturing method of a semiconductor integrated circuit device, comprising the steps of:
- (a) forming a to-be-treated undercoat film over a first main surface of each of first and second wafers;
- (b) forming a photoresist film over the to-be-treated undercoat film formed over the first main surface of each of the first and second wafers;
- (c) exposing and developing the photoresist film formed over the first main surface of the first wafer by a reduced projection exposure apparatus to form a line and space pattern through the photoresist film;
- (d) measuring the line and space pattern formed over the first main surface of the first wafer optically by scatterometry to acquire parameters on a two-dimensional shape of a section of the line and space pattern;
- (e) estimating a focus condition and an exposure dose independently on the basis of the parameters;
- (f) on the basis of the estimated focus condition and exposure dose, correcting a focus setting and an exposure dose setting both included among exposure conditions in the reduced projection exposure apparatus; and
- (g) on the basis of the corrected exposure conditions, exposing and developing the photoresist film formed over the first main surface of the second wafer by the reduced projection exposure apparatus to form a circuit pattern through the photoresist film, wherein the estimation in step (e) comprises performing a calculation using the parameters acquired in step (d) and using a conjectural expression obtained by multivariate regression analysis of a partial least squares (PLS) method.

12. The method according to claim 11, wherein the first and second wafers are both product wafers.

13. The method according to claim 12, wherein the line and space pattern formed over the first wafer is a product pattern.

14. The method according to claim 12, wherein the line and space pattern formed over the first wafer is an inspection pattern.

15. The method according to claim 11, wherein a scatterometer used in the scatterometry is a vertical incidence type or an oblique incidence type.

* * * * *